(12) United States Patent
Amemiya

(10) Patent No.: US 7,372,388 B2
(45) Date of Patent: May 13, 2008

(54) A/D CONVERTER, A/D CONVERTER CONTROL METHOD, AND A/D CONVERTER CONNECTION METHOD

(75) Inventor: Shinichi Amemiya, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/507,762

(22) Filed: Aug. 22, 2006

(65) Prior Publication Data

US 2007/0046522 A1   Mar. 1, 2007

(30) Foreign Application Priority Data

Aug. 24, 2005   (JP)   ............................. 2005-242072

(51) Int. Cl.
*H03M 1/12*   (2006.01)
(52) U.S. Cl. .................. 341/155; 341/135; 341/136
(58) Field of Classification Search ............. 341/131, 341/136, 139, 155; 326/30, 37; 327/108, 327/112
See application file for complete search history.

(56) References Cited

U.S. PATENT DOCUMENTS

| 4,081,800 | A | 3/1978 | Amemiya |
| 4,195,283 | A | 3/1980 | Ishikawa |
| 4,754,257 | A | 6/1988 | Takahashi |
| 6,326,846 | B1 * | 12/2001 | Brandt ........................ 330/253 |
| 6,369,732 | B1 * | 4/2002 | Liu et al. ..................... 341/143 |
| 6,590,422 | B1 * | 7/2003 | Dillon .......................... 326/86 |
| 6,628,223 | B2 * | 9/2003 | Nagano ....................... 341/155 |
| 6,700,403 | B1 * | 3/2004 | Dillon .......................... 326/37 |
| 6,700,522 | B2 * | 3/2004 | Ivanov et al. ................ 341/155 |
| 6,781,449 | B2 * | 8/2004 | Schrodinger et al. .......... 330/9 |
| 6,873,272 | B2 | 3/2005 | Pezzini |
| 2003/0218482 | A1 * | 11/2003 | Ivanov et al. ............... 327/134 |
| 2007/0063739 | A1 * | 3/2007 | Kim .............................. 326/83 |

FOREIGN PATENT DOCUMENTS

JP   2004-057525   2/2004

* cited by examiner

*Primary Examiner*—Linh V. Nguyen
(74) *Attorney, Agent, or Firm*—Armstrong Teasdale LLP

(57) ABSTRACT

The present invention is intended to provide an A/D converter making it possible to reduce the power consumption of an output interface. The A/D converter includes an output current value designation register that holds a value sent from an upper-level unit, and an output current value designation circuit that controls a constant current source, which supplies a constant current to a low-voltage differential signal output circuit, according to the value held in the output current value designation register so as to designate an output current value.

16 Claims, 7 Drawing Sheets

A/D CONVERTER, A/D CONVERTER CONTROL METHOD, AND A/D CONVERTER CONNECTION METHOD

CROSS REFERENCE TO RELATED APPLICATIONS

This application claims the benefit of Japanese Application No. 2005-242072 filed Aug. 24, 2005.

BACKGROUND OF THE INVENTION

The present invention relates to an analog-to-digital (A/D) converter, an A/D converter control method, and an A/D converter connection method. More particularly, the present invention is concerned with an A/D converter making it possible to reduce the power consumption of an output interface, and a control method and a connection method for the A/D converter.

In the past, a low-voltage differential signaling (LVDS) technology has been known as a technology for transmitting a low-voltage differential signal over a signal line pair while reducing power consumption or electromagnetic interference (EMI) (refer to, for example, Non-patent Document 1).

[Non-Patent Document 1] LVDS Owner's Manual & Design Guide (spring in 1997, National Semiconductor)

In recent years, an attempt has been made to employ a low-voltage differential signaling (LVDS) technology in transmitting an output of an A/D converter incorporated in a diagnostic ultrasound system.

In the LVDS technology, an output current shall be approximately 3.5 mA, a resistance of a terminal resistor shall be 100Ω, and a voltage at both terminals of the terminal resistor shall be 350 mV. Assuming that a supply voltage is 2 V and a margin offered by an A/D converter is about 30%, a power of approximately 10 mW is always consumed for each signal (a current flows all the time because it carries a differential signal).

On the other hand, the power consumption of an A/D converter itself is being reduced and has decreased to approximately 20 mW these several years.

However, when the power consumption of the A/D converter itself has decreased to approximately 20 mW, the consumption of the power of approximately 10 mW by an output interface cannot be ignored.

SUMMARY OF THE INVENTION

Therefore, an object of the present invention is to provide an A/D converter making it possible to reduce the power consumption of an output interface, and a control method and a connection method for the A/D converter.

According to the first aspect of the present invention, there is provided an A/D converter having a low-voltage differential signal output circuit and including an output current value designation means for designating an output current value so that output currents be fed from the low-voltage differential signal output circuit can be changed.

In the A/D converter according to the first aspect, the output current value designation means is included so that output currents to be fed from the low-voltage differential signal output circuit can be changed. Consequently, when the output current is set to, for example, 1.75 mA and the resistance of a terminal resistor is set to 200Ω, the voltage at the terminals of the terminal resistor is retained at 350 mV. If a supply voltage is 2 V and a margin offered by the A/D converter is about 30%, the power consumption per a signal is approximately 5 mW. Thus, the power consumption is reduced.

According to the second aspect of the present invention, there is provided an A/D converter control method in which output currents are changed between an active mode in which the output of the A/D converter in accordance with the first aspect is valid and a sleep mode in which the output thereof is invalid.

For example, when the A/D converter in accordance with the first aspect is incorporated in a receiving system included in a diagnostic ultrasound system, the A/D converter must be operated during a period during which ultrasonic echoes are received, but need not be operated during the other period.

In the A/D converter control method according to the second aspect, output currents are changed between the active mode in which the output of the A/D converter is valid (the A/D converter must be operated) and the sleep mode in which the output of the A/D converter is invalid (the A/D converter need not be operated). Consequently, when the output current fed in the sleep mode is, for example, about a one-fourth of the output current fed in the active mode, the power consumption of the output interface can be further reduced.

According to the third aspect of the present invention, there is provided an A/D converter identical to the A/D converter according to the first aspect except that the output current value designation means designates an output current value according to a value held in an output current value designation register.

In the A/D converter according to the third aspect, values to be held in the output current value designation register are changed, whereby an output current value can be changed to a desired value.

According to the fourth aspect of the present invention, there is provided an A/D converter control method in which values to be held in an output current value designation register are changed between an active mode in which the output of the A/D converter in accordance with the third aspect is valid and a sleep mode in which the output thereof is invalid.

In the A/D converter control method according to the fourth aspect, values to be held in the output current value designation register are changed, whereby the values of the output current can be changed between the active and sleep modes.

According to the fifth aspect of the present invention, there is provided an A/D converter identical to the A/D converter according to the first aspect except that the output current value designation means designates an output current value according to a voltage applied to an output current value designation terminal.

In the A/D converter according to the fifth aspect, voltages to be applied to the output current value designation terminal are changed, whereby an output current value can be changed to a desired value.

According to the sixth aspect of the present invention, there is provided an A/D converter control method in which voltages to be applied to an output current value designation terminal are changed between an active mode in which the output of the A/D converter in accordance with the fifth aspect is valid and a sleep mode in which the output thereof is invalid.

In the A/D converter control method according to the sixth aspect, voltages to be applied to the output current value designation terminal are changed, whereby the values of the output current can be changed between the active and sleep modes.

According to the seventh aspect of the present invention, there is provided an A/D converter identical to the A/D converter in accordance with the first aspect except that the output current value designation means designates an output current value according to a current fed to the output current value designation terminal.

In the A/D converter according to the seventh aspect, currents to be fed to the output current value designation terminal are changed, whereby an output current value can be changed to a desired value.

According to the eighth aspect of the present invention, there is provided an A/D converter control method in which currents to be fed to an output current value designation terminal are changed between an active mode in which the output of the A/D converter in accordance with the seventh aspect is valid and a sleep mode in which the output thereof is invalid.

In the A/D converter control method according to the eighth aspect, currents to be fed to the output current value designation terminal are changed, whereby the values of the output current can be changed between the active and sleep modes.

According to the ninth aspect of the present invention, there is provided an A/D converter identical to the A/D converter in accordance with the first aspect except that the output current value designation means designates an output current value according to a resistance offered by a resistor connected to a resistor connection terminal.

In the A/D converter according to the ninth aspect, the resistor connected to the resistor connection terminal is replaced with a resistor offering a different resistance, whereby an output current value can be changed to a desired value.

According to the tenth aspect of the present invention, there is provided an A/D converter control method in which resistors that offer different resistances and are connected to a resistor connection terminal are changed between an active mode in which the output of the A/D converter in accordance with the ninth aspect is valid and a sleep mode in which the output thereof is invalid.

In the A/D converter control method according to the tenth aspect, resistors that are connected to the resistor connection terminal and offer different resistances are changed, whereby the values of the output current can be switched between the active and sleep modes.

According to the eleventh aspect of the present invention, there is provided an A/D converter control method identical to the A/D converter control method in accordance with any of the second, fourth, sixth, eighth, and tenth aspects except that the A/D converter is incorporated in a receiving system included in a diagnostic ultrasound system and that a period during which ultrasonic echoes are received is a period during which the active mode is validated and the other period is a period during which the sleep mode is validated.

In the A/D converter control method according to the eleventh aspect, the power consumption of the output interface is reduced during the period other than the period during which ultrasonic echoes are received.

According to the twelfth aspect of the present invention, there is provided an A/D converter identical to the A/D converter in accordance with the first aspect except that the A/D converter further includes a sleep current value designation means for designating an output current value smaller than the output current value designated by the output current value designation means, and a mode selection means for selecting either of the output current value designation means and the sleep current value designation means as a means, to which priority is given, according to a value held in a mode designation register.

In the A/D converter according to the twelfth aspect, values to be held in the mode designation register are changed, whereby the values of the output current can be switched between the active and sleep modes.

According to the thirteenth aspect of the present invention, there is provided an A/D converter identical to the A/D converter in accordance with the first aspect except that the A/D converter further includes a sleep current value designation means for designating an output current value smaller than the output current value designated by the output current value designation means, and a mode selection means for selecting either of the output current value designation means and the sleep current value designation means as a means, to which priority is given, according to a voltage applied to a mode designation terminal.

In the A/D converter according to the thirteenth aspect, voltages to be applied to the mode designation terminal are changed, whereby the values of the output current can be switched between the active and sleep modes.

According to the fourteenth aspect of the present invention, there is provided an A/D converter identical to the A/D converter in accordance with the first aspect except that the A/D converter further includes a sleep current value designation means for designating an output current value smaller than the output current value designated by the output current value designation means, and a mode selection means for selecting either of the output current value designation means and the sleep current value designation means as a means, to which priority is given, according to a current fed to a mode designation terminal.

In the A/D converter according to the fourteenth aspect, currents to be fed to the mode designation terminal are changed, whereby the values of the output current can be switched between the active and sleep modes.

According to the fifteenth aspect of the present invention, there is provided an A/D converter identical to the A/D converter in accordance with any of the twelfth, thirteenth, and fourteenth aspects except that the A/D converter is incorporated in a receiving system included in a diagnostic ultrasound system and that a period during which ultrasonic echoes are received is a period during which the active mode is validated and the other period is a period during which the sleep mode is validated.

In the A/D converter according to the fifteenth aspect, the power consumption of the output interface can be reduced during the period other than the period during which ultrasonic echoes are received.

According to the sixteenth aspect of the present invention, there is provided an A/D converter identical to the A/D converter in accordance with any of the first, third, fifth, seventh, ninth, and twelfth to fifteenth aspects except that an output current value designated by the output current value designation means is equal to or smaller than 1.75 mA.

In the A/D converter according to the sixteenth aspect, when the resistance of the terminal resistor is set to, for example, 200Ω, the voltage at the terminals of the terminal resistor is retained at 350 mV. If a supply voltage is 2 V and a margin offered by the A/D converter is about 30%, the power consumption per a signal is approximately 5 mW. Thus, the power consumption can be reduced.

According to the seventeenth aspect of the present invention, there is provided an A/D converter connection method in which: a terminal resistor is connected near a pair of input terminals of a succeeding circuit which is connected to a pair of output terminals of the A/D converter in accordance with any of the first, third, fifth, seventh, ninth, and twelfth to sixteenth aspects over a signal line pair; and at least one of the characteristic impedance of the signal line pair and the resistance of the terminal resistor is adjusted in order to ensure a certain amplitude for a signal at the pair of input terminals.

In the A/D converter connection method according to the seventeenth aspect, at least one of the characteristic impedance of the signal line pair and the resistance of the terminal resistor is adjusted in order to ensure a certain amplitude for a signal at the pair of input terminals.

According to an A/D converter, an A/D converter control method, and an A/D converter connection method in which the present invention is implemented, the power consumption of an output interface can be reduced.

An A/D converter, an A/D converter control method, and an A/D converter connection method in accordance with the present invention can be employed in a diagnostic ultrasound system.

Further objects and advantages of the present invention will be apparent from the following description of the preferred embodiments of the invention as illustrated in the accompanying drawings.

DETAILED DESCRIPTION OF THE INVENTION

The present invention will be described by taking illustrated embodiments for instance. Noted is that the present invention will not be limited to the embodiments.

First Embodiment

Figure 1:
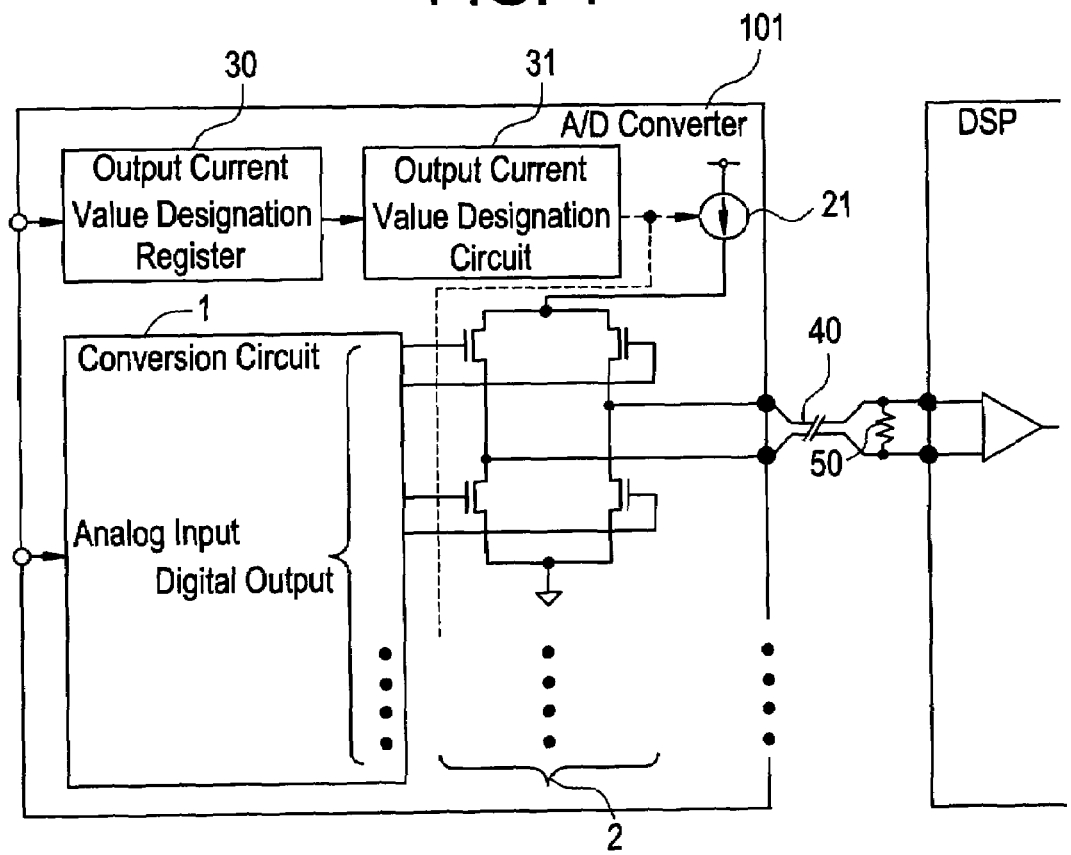
FIG. 1 is a circuit diagram showing an A/D converter in accordance with the first embodiment.

FIG. 1 is a circuit diagram showing an analog-to-digital (A/D) converter 101 in accordance with the first embodiment.

The A/D converter 101 includes: a conversion circuit 1 that converts an analog input into a digital output; a low-voltage differential signal output circuit 2 that transmits a low-voltage differential signal, which is conformable to a low-voltage differential signaling (LVDS) technology, for each bit of the digital output; an output current value designation register 30 that holds a value sent from an upper-level unit; and an output current value designation circuit 31 that controls a constant current source 21, which supplies a constant current to the low-voltage differential signal output circuit 2, according to the value held in the output current value designation register 30 so as to designate an output current value.

When the orientation of an output current flowing through a pair of output terminals of the A/D converter 101 is inverted based on whether the A/D converter 101 transmits a 1 or a 0 through the pair of output terminals. Nevertheless, the output current assumes the same value.

The values of the output current can be changed by changing a value held in the output current value designation register 30 from one to another.

The A/D converter 101 is provided in the form of an integrated circuit and incorporated in a receiving system included in a diagnostic ultrasound system.

One end of a signal line pair 40 is connected to the pair of output terminals of the A/D converter 101, and the other end of the signal line pair 40 is connected to a pair of input terminals of a digital signal processor (DSP) that is a succeeding circuit.

A terminal resistor 50 is connected near the pair of input terminals of the DSP.

Figure 2:
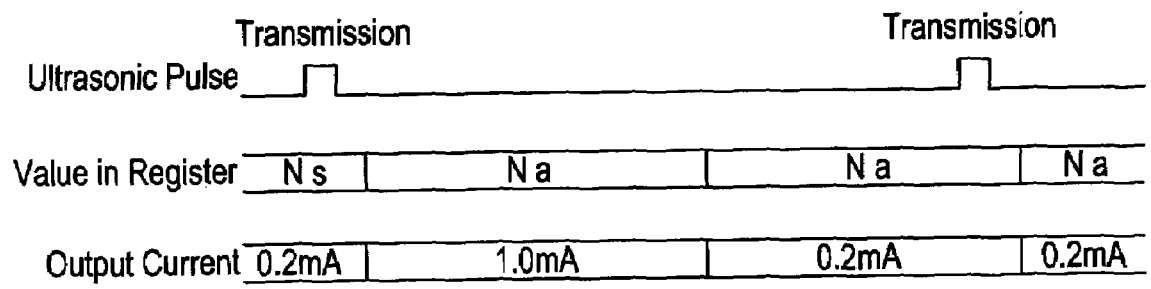
FIG. 2 is a timing chart showing a control method for the A/D converter in accordance with the first embodiment.

FIG. 2 is a timing chart showing the timing of transmitting an ultrasonic pulse, a change of values to be held in the output current value designation register 30, and a change of output currents to be fed through the pair of output terminals of the A/D converter 101.

During a period during which a value Na is held in the register, ultrasonic echoes are received, and an active mode in which the A/D converter should be operated is validated. During the period of the active mode, an output current of, for example, 1.0 mA is fed. In this case, the resistance of the terminal resistor 50 shall be 350Ω. Assuming that a supply voltage is 2 V and the margin of the A/D converter is about 30%, the power consumption per a signal is approximately 3 mW. The power consumption can thus be reduced.

During a period during which a value Ns is held in the register, a sleep mode in which the A/D converter need not be operated is validated. During the period of the sleep mode, an output current of, for example, 0.2 mA is fed. Assuming that a supply voltage is 2 V and the margin of the A/D converter is about 30%, the power consumption is approximately 0.6 mW. The power consumption can thus be reduced.

Second Embodiment

Figure 3:
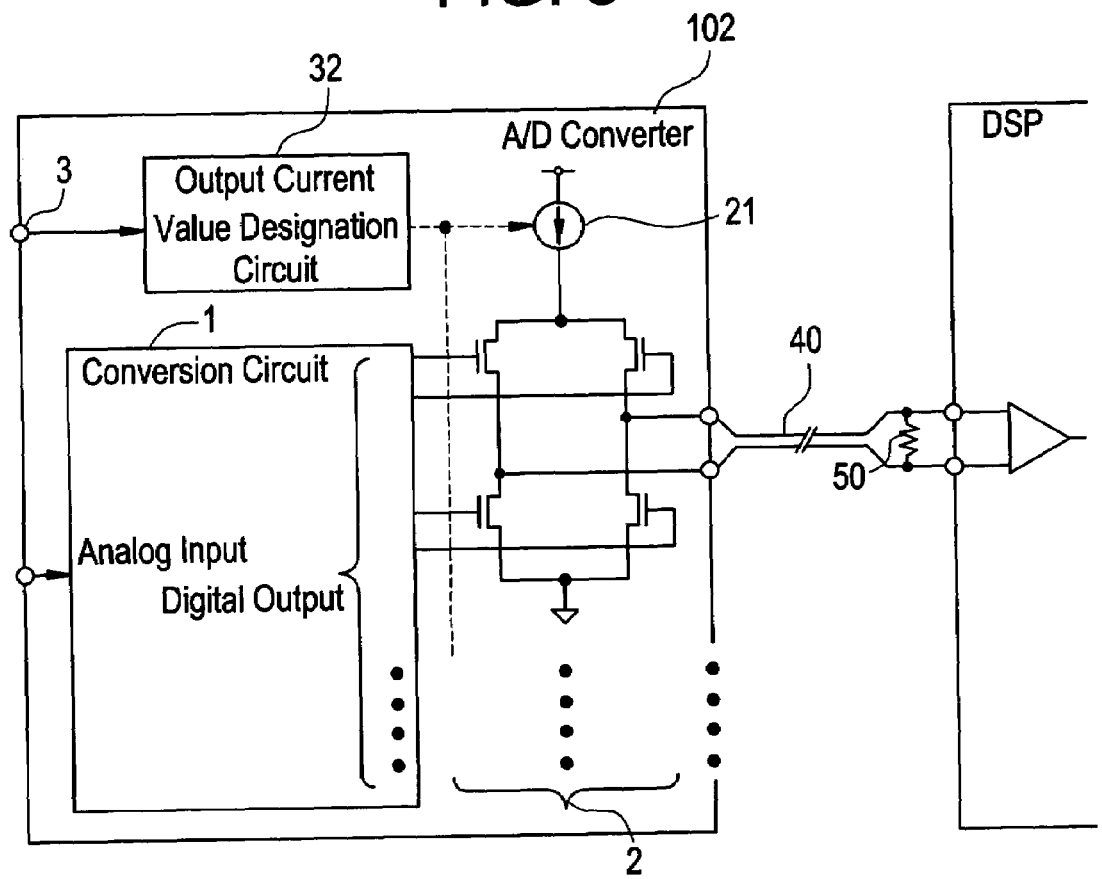
FIG. 3 is a circuit diagram showing an A/D converter in accordance with the second embodiment.

FIG. 3 is a circuit diagram showing an A/D converter 102 in accordance with the second embodiment.

The A/D converter 102 includes: a conversion circuit 1 that converts an analog input to a digital output; a low-voltage differential signal output circuit 2 that transmits a low-voltage differential signal, which is conformable to the LVDS technology, for each bit of the digital output; and an output current value designation circuit 32 that controls a constant current source 21, which supplies a constant current to the low-voltage differential signal output circuit 2, according to a voltage applied from an upper-level unit to an output current value designation terminal 3 so as to change the values of an output current.

Figure 4:
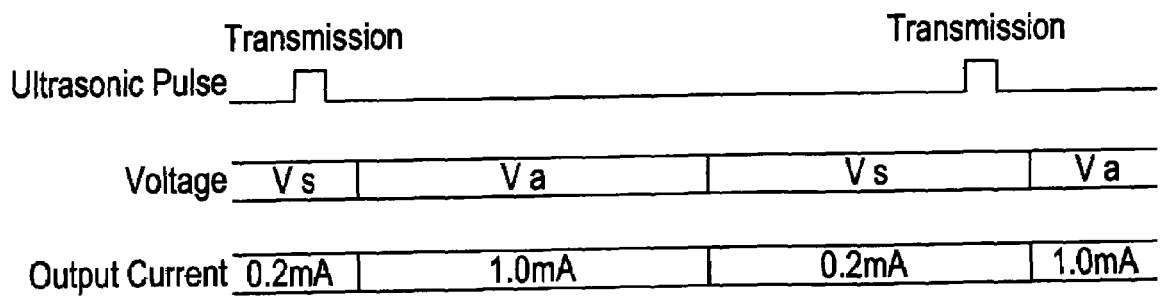
FIG. 4 is a timing chart showing a control method for the A/D converter in accordance with the second embodiment.

FIG. 4 is a timing chart showing the timing of transmitting an ultrasonic pulse, a change of voltages to be applied to the output current value designation terminal 3, and a change of output currents to be fed through the pair of output terminals of the A/D converter 102.

During a period during which a voltage Va is applied, ultrasonic echoes are received, and an active mode in which the A/D converter should be operated is validated. During the period of the active mode, an output current of, for example, 1.0 mA is fed.

During a period during which a voltage Vs is applied, a sleep mode in which the A/D converter need not be operated is validated. During the period of the sleep mode, an output current of, for example, 0.2 mA is fed.

Third Embodiment

Figure 5:
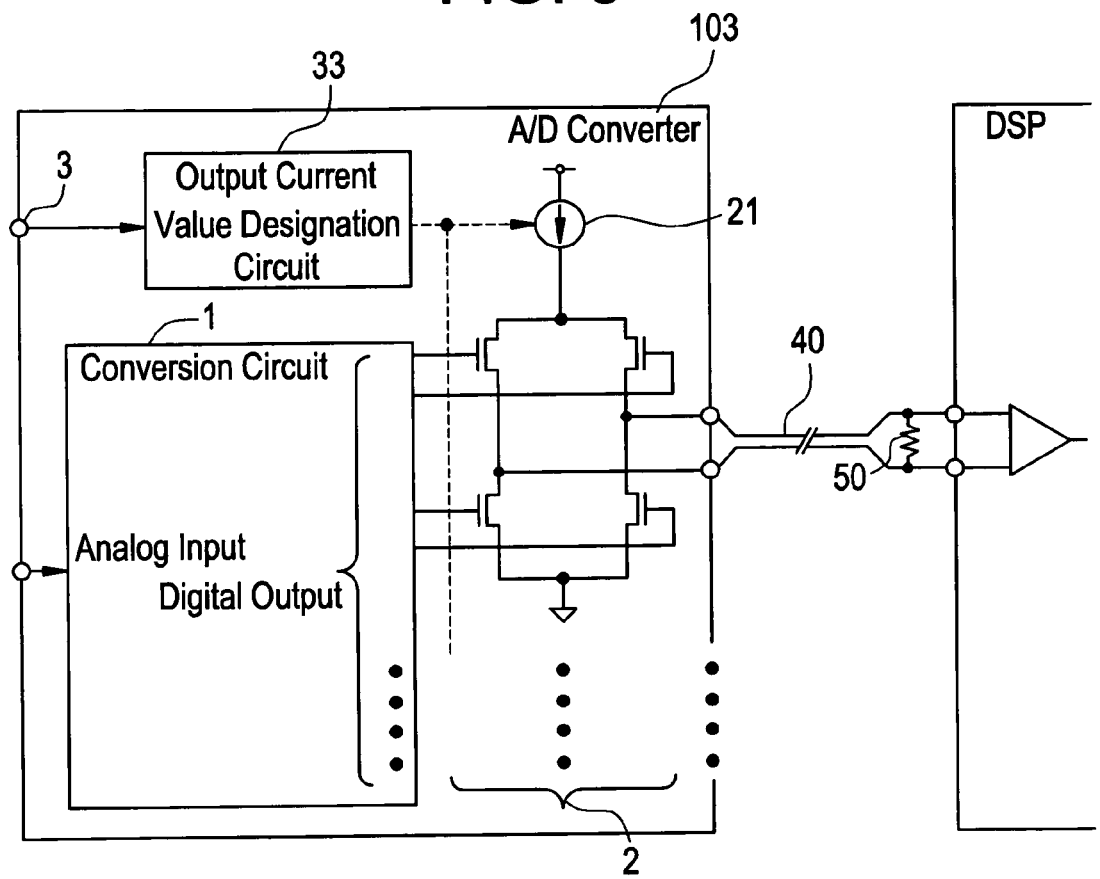
FIG. 5 is a circuit diagram showing an A/D converter in accordance with the third embodiment.

FIG. 5 is a circuit diagram showing an A/D converter 103 in accordance with the third embodiment.

The A/D converter 103 includes: a conversion circuit 1 that converts an analog input into a digital output; a low-voltage differential signal output circuit 2 that transmits a low-voltage differential signal, which is conformable to the LVDS technology, for each bit of the digital output; and an output current value designation circuit 33 that controls a constant current source 21, which supplies a constant current to the low-voltage differential signal output circuit 2, according to a current supplied from an upper-level unit to an output current value designation terminal 3 so as to change the values of an output current.

Figure 6:
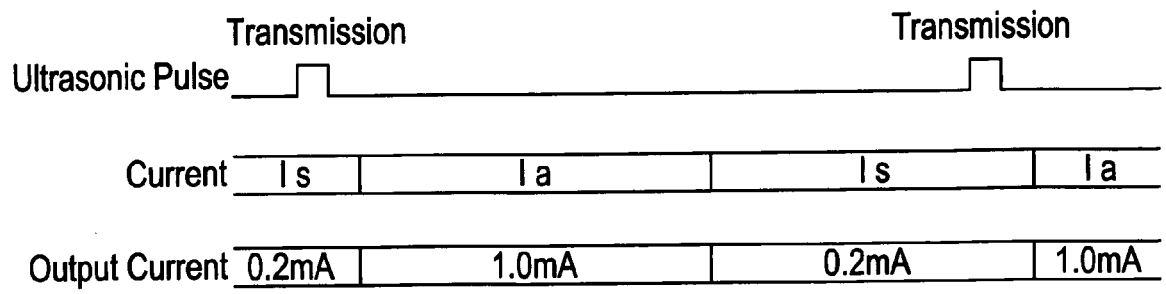
FIG. 6 is a timing chart showing a control method for the A/D converter in accordance with the third embodiment.

FIG. 6 is a timing chart showing the timing of transmitting an ultrasonic pulse, a change of currents to be supplied to the output current value designation terminal 3, and a change of output currents to be fed through the pair of output terminals of the A/D converter 103.

During a period during which a current Ia is supplied, ultrasonic echoes are received, and an active mode in which the A/D converter should be operated is validated. During the period of the active mode, an output current of, for example, 1.0 mA is fed.

During a period during which a current Is is supplied, a sleep mode in which the A/D converter need not be operated is validated. During the period of the sleep mode, an output current of, for example, 0.2 mA is fed.

Fourth Embodiment

Figure 7:
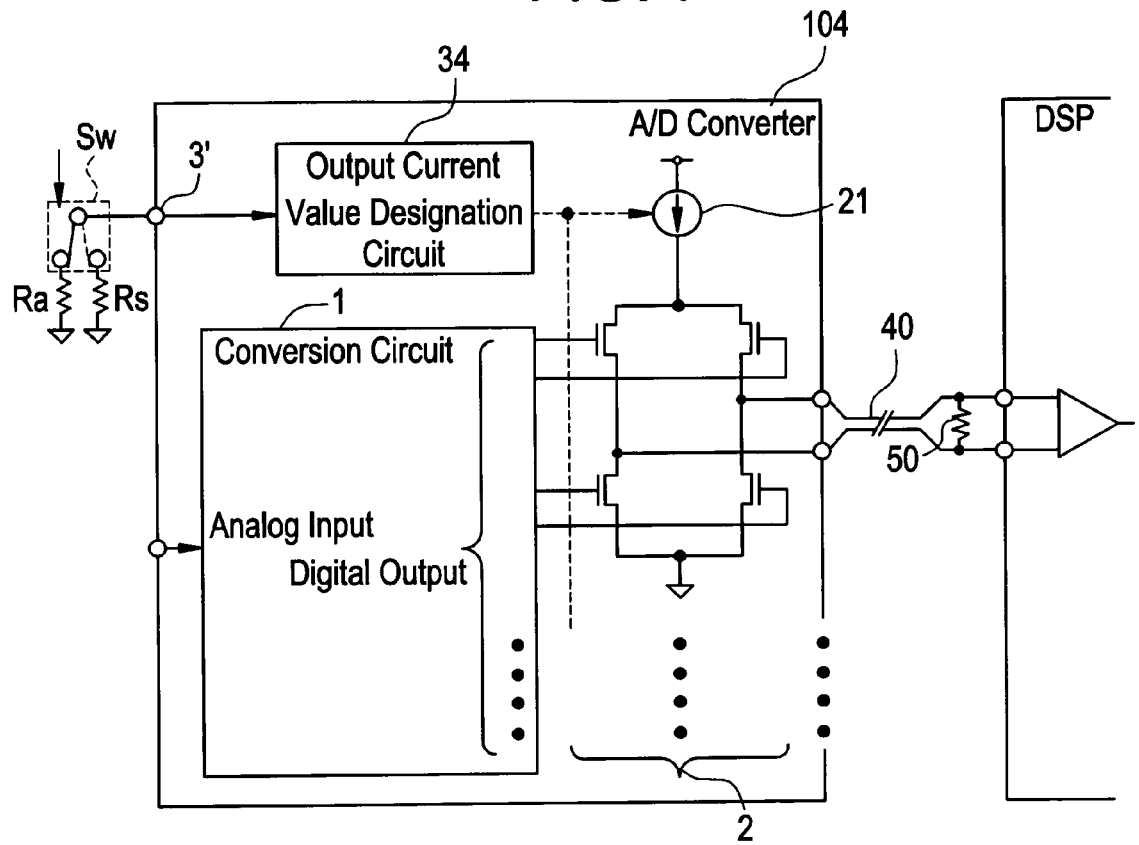
FIG. 7 is a circuit diagram showing an A/D converter in accordance with the fourth embodiment.

FIG. 7 is a circuit diagram showing an A/D converter 104 in accordance with the fourth embodiment.

The A/D converter 104 includes: a conversion circuit 1 that converts an analog input to a digital output; a low-voltage differential signal output circuit 2 that transmits a low-voltage differential signal, which is conformable to the LVDS technology, for each bit of the digital output; and an output current value designation circuit 34 that controls a constant current source 21, which supplies a constant current to the low-voltage differential signal output circuit 2, according to the resistance of a resistor connected to a resistor connection terminal 3' so as to change the values of an output current.

A switch Sw whose connections are switched by an upper-level unit is connected to the resistor connection terminal 3'. One of registers Rb and Rs is selected and connected to the resistor connection terminal 3' via the switch Sw. Herein, the resistor Ra shall offer a resistance Ra and the resistor Rs shall offer a resistance Rs.

Figure 8:
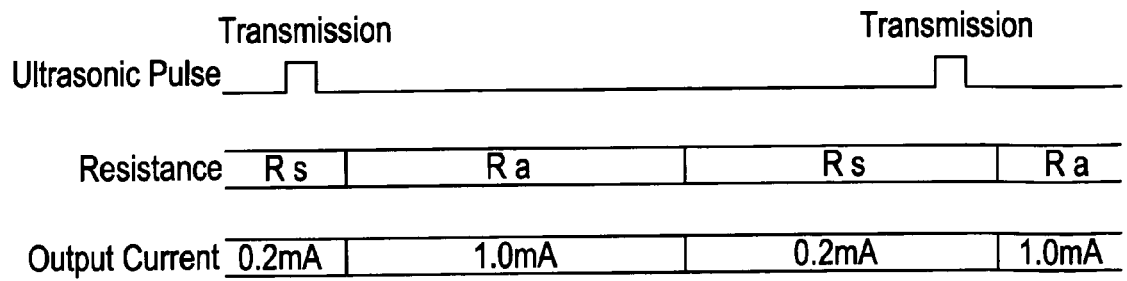
FIG. 8 is a timing chart showing a control method for the A/D converter in accordance with the fourth embodiment.

FIG. 8 is a timing chart showing the timing of transmitting an ultrasonic pulse, a change of resistances to be offered by the resistor connected to the resistor connection terminal 3', and a change of output currents to be fed through the pair of output terminals of the A/D converter 104.

During a period during which a resistance Ra is offered, ultrasonic echoes are received, and an active mode in which the A/D converter should be operated is validated. During the period of the active mode, an output current of, for example, 1.0 mA is fed.

During a period during which a resistance Rs is offered, a sleep mode in which the A/D converter need not be operated is validated. During the period of the sleep mode, an output current of, for example, 0.2 mA is fed.

Fifth Embodiment

Figure 9:
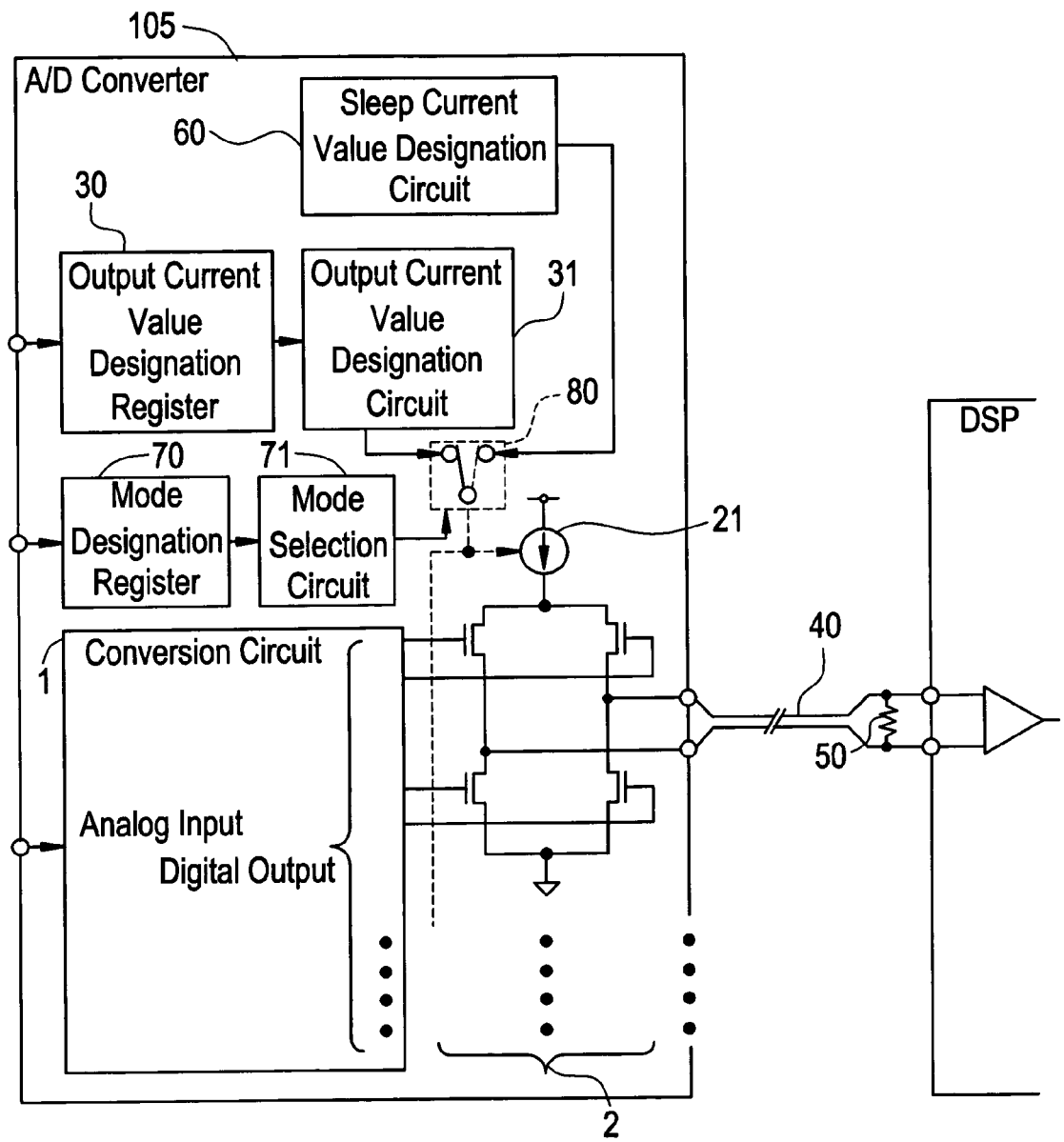
FIG. 9 is a circuit diagram showing an A/D converter in accordance with the fifth embodiment.

FIG. 9 is a circuit diagram showing an A/D converter 105 in accordance with the fifth embodiment.

The A/D converter 105 includes: a conversion circuit 1 that converts an analog input into a digital output; a low-voltage differential signal output circuit 2 that transmits a low-voltage differential signal, which is conformable to the LVDS technology, for each bit of the digital output; an output current value designation register 30 which holds a value sent from an upper-level unit; an output current value designation circuit 31 that controls a constant current source 21, which supplies a constant current to the low-voltage differential signal output circuit 2, according to a value held in the output current value designation register 30 so as to designate an output current value; a sleep current value designation circuit 60 that controls the constant current source 21, which supplies a constant current to the low-voltage differential signal output circuit 2, so as to designate an output current value smaller than the output current value designated by the output current value designation circuit 31; a mode designation register 70 that holds a value sent from the upper-level unit; a mode selection circuit 71 that selects either of the output current value designation circuit 31 and the sleep current value designation circuit 60 as a circuit, to which priority is given, according to the value held in the mode designation register 70; and a switch 80 via which the output current value designation circuit 31 or the sleep current value designation circuit 60 that is selected by the mode selection circuit 71 is connected to the constant current source 21.

Values to be held in the mode designation register 70 are changed, whereby the active and sleep modes are switched.

Figure 10:
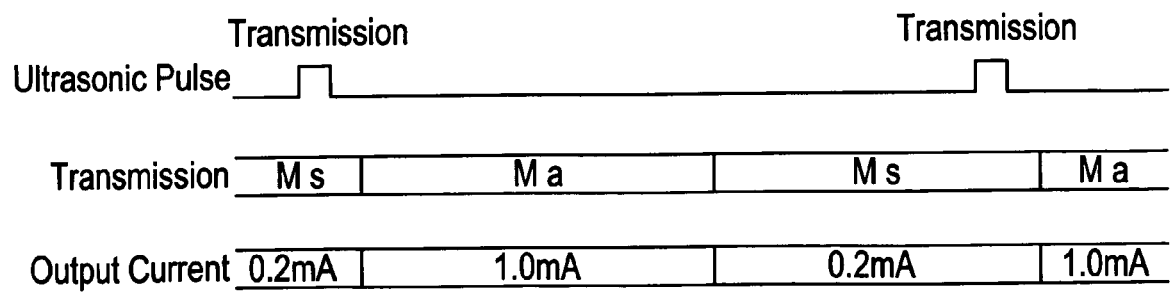
FIG. 10 is a timing chart showing a control method for the A/D converter in accordance with the fifth embodiment.

FIG. 10 is a timing chart showing the timing of transmitting an ultrasonic pulse, a change of values to be held in the mode designation register 70, and a change of output currents to be fed through the pair of output terminals of the A/D converter 105.

During a period during which a value Ma is held in the register, ultrasonic echoes are received, and an active mode in which the A/D converter should be operated is validated. During the period of the active mode, an output current of, for example, 1.0 mA is fed.

During a period during which a value Ms is held in the register, a sleep mode in which the A/D converter need not be operated is validated. During the period of the sleep mode, an output current of, for example, 0.2 mA is fed.

Sixth Embodiment

Figure 11:
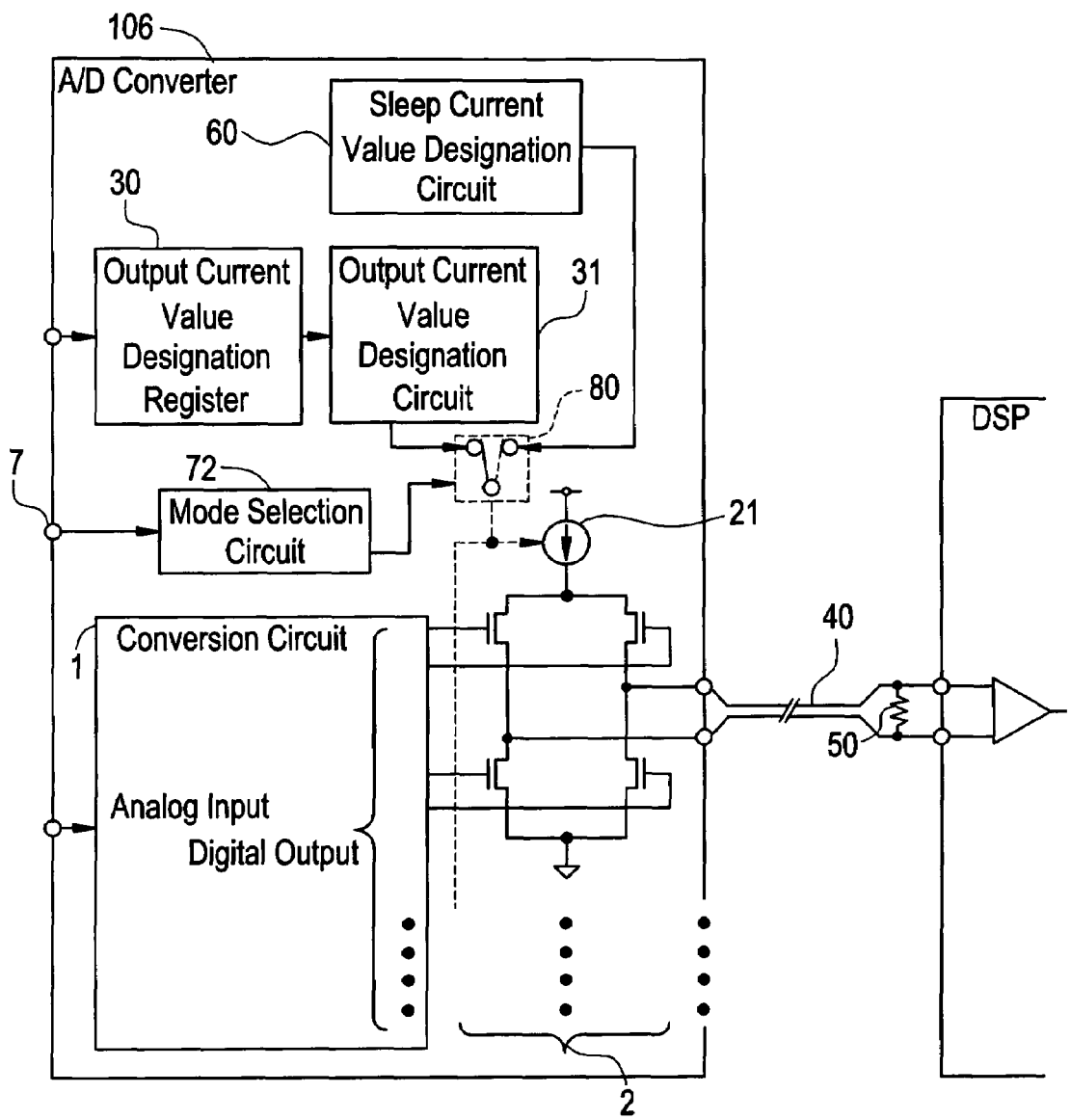
FIG. 11 is a circuit diagram showing an A/D converter in accordance with the sixth embodiment.

FIG. 11 is a circuit diagram showing an A/D converter 106 in accordance with the sixth embodiment.

The A/D converter 106 includes: a conversion circuit 1 that converts an analog input to a digital output; a low-voltage differential signal output circuit 2 that transmits a low-voltage differential signal, which is conformable to the LVDS technology, for each bit of the digital output; an output current value designation register 30 that holds a value sent from an upper-level unit; an output current value designation circuit 31 that controls a constant current source 21, which supplies a constant current to the low-voltage differential signal output circuit 2, according to the value held in the output current value designation register 30 so as to designate an output current value; a sleep current value designation circuit 60 that controls the constant current source 21, which supplies a constant current to the low-voltage differential signal output circuit 2, so as to designate an output current value smaller than the output current value designated by the output current value designation circuit 31; a mode selection circuit 72 that selects either of the output current value designation circuit 31 and the sleep current value designation circuit 60 as a circuit, to which priority is given, according to a voltage applied to a mode designation terminal 7 by the upper-level unit; and a switch 80 via which the output current value designation circuit 31 or the sleep current value designation circuit 60 selected by the mode selection circuit 72 is connected to the constant current source 21.

Voltages to be applied to the mode designation terminal 7 are changed, whereby the active and sleep modes are switched.

Figure 12:
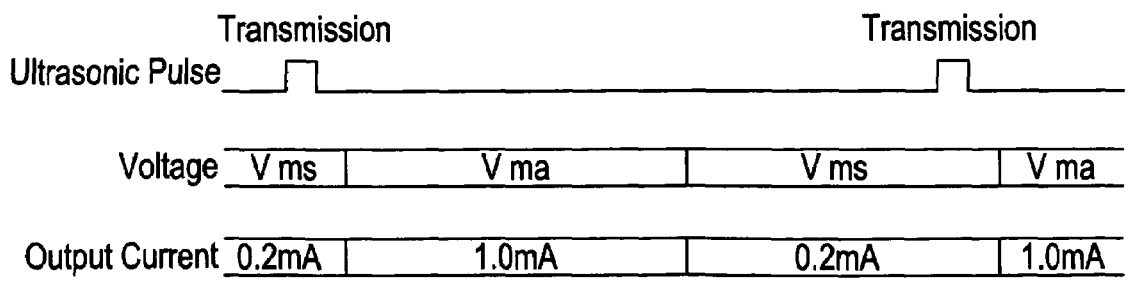
FIG. 12 is a timing chart showing a control method for the A/D converter in accordance with the sixth embodiment.

FIG. 12 is a timing chart showing the timing of transmitting an ultrasonic pulse, a change of voltages to be applied to the mode designation terminal 7, and a change of output currents to be fed through the pair of output terminals of the A/D converter 106.

During a period during which a voltage Vma is applied, ultrasonic echoes are received, and an active mode in which the A/D converter should be operated is validated. During the period of the active mode, an output current of, for example, 1.0 mA is fed.

During a period during which a voltage Vms is applied, a sleep mode in which the A/D converter need not be operated is validated. During the period of the sleep mode, an output current of, for example, 0.2 mA is fed.

Seventh Embodiment

Figure 13:
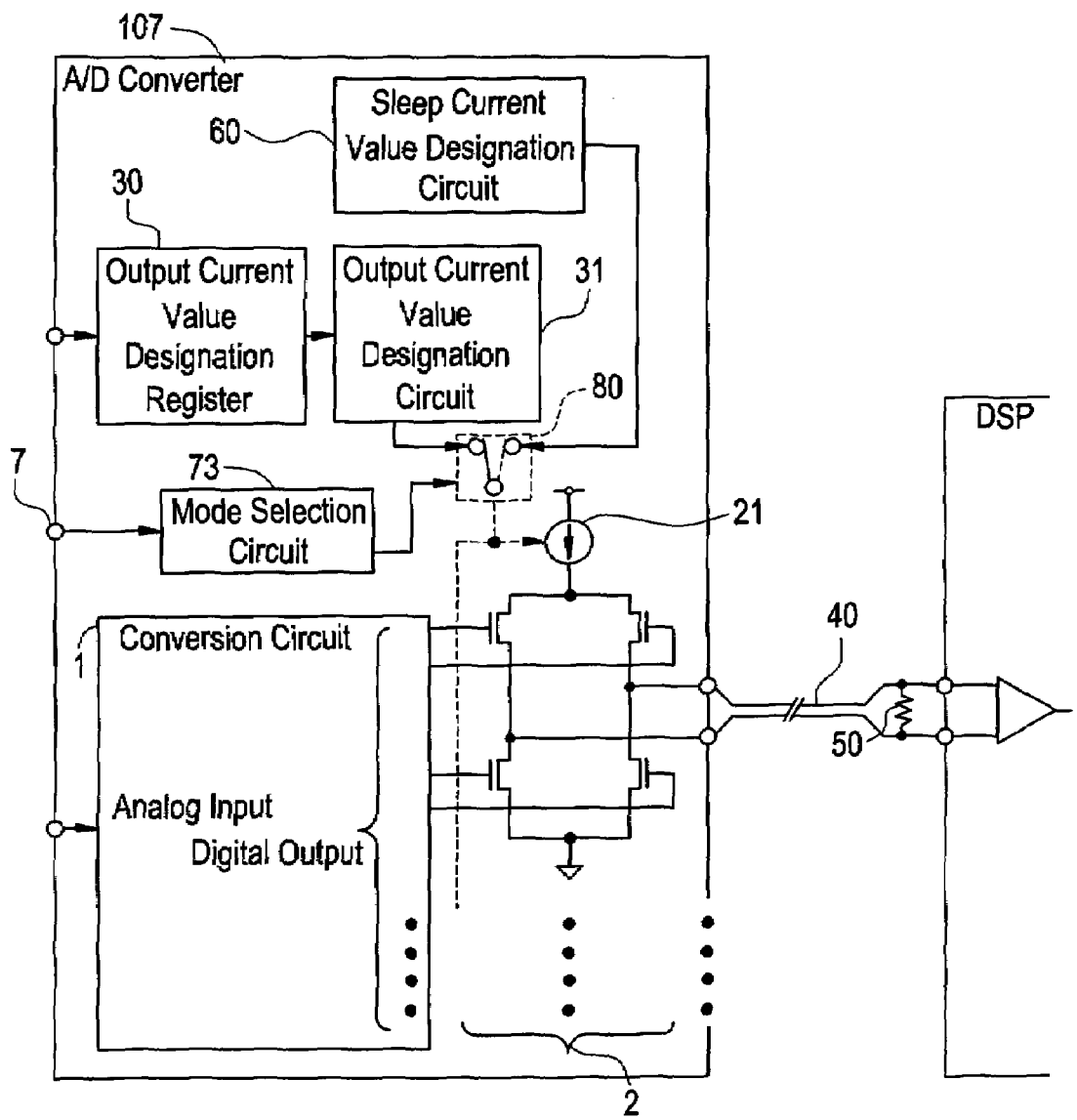
FIG. 13 is a circuit diagram showing an A/D converter in accordance with the seventh embodiment.

FIG. 13 is a circuit diagram showing an A/D converter 107 in accordance with the seventh embodiment.

The A/D converter 107 includes: a conversion circuit 1 that converts an analog input to a digital output; a low-voltage differential signal output circuit 2 that transmits a low-voltage differential signal, which is conformable to the LVDS technology, for each bit of the digital output; an output current value designation register 30 that holds a value sent from an upper-level unit; an output current value designation circuit 31 that controls a constant current source 21, which supplies a constant current to the low-voltage differential signal output circuit 2, according to a value held in the output current value designation register 30; a sleep current value designation circuit 60 that controls the constant current source 21, which supplies a current to the low-voltage differential signal output circuit 2, so as to designate an output current value smaller than the output current value designated by the output current value designation circuit 31; a mode selection circuit 73 that selects either of the output current value designation circuit 31 and the sleep current value designation circuit 60 as a circuit, to which priority is given, according to a current supplied from the upper-level unit to the mode designation terminal 7; and a switch 80 via which the output current value designation circuit 31 or the sleep current value designation circuit 60 that is selected by the mode selection circuit 73 is connected to the constant current source 21.

Voltages to be applied to the mode designation terminal 7 are changed, whereby the active and sleep modes are switched.

Figure 14:
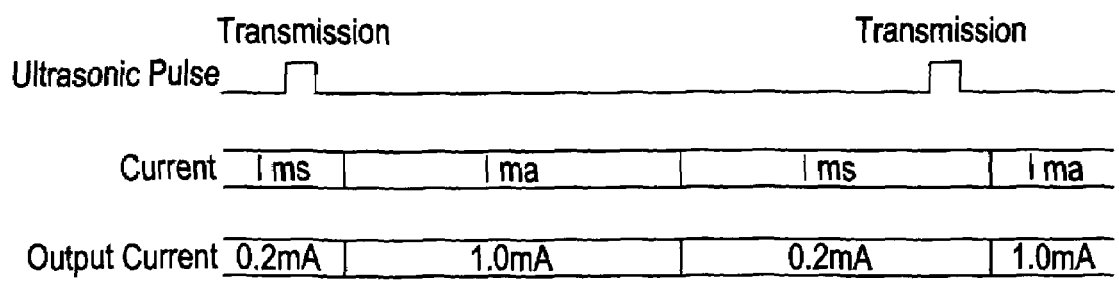
FIG. 14 is a timing chart showing a control method for the A/D converter in accordance with the seventh embodiment.

FIG. 14 is a timing chart showing the timing of transmitting an ultrasonic pulse, a change of currents to be supplied to the mode designation terminal 7, and a change of output currents to be fed through the pair of output terminals of the A/D converter 107.

During a period during which a current Ima is supplied, ultrasonic echoes are received, and an active mode in which the A/D converter should be operated is validated. During the period of the active mode, an output current of, for example, 1.0 mA is fed.

During a period during which a current Ims is supplied, a sleep mode in which the A/D converter need not be operated is validated. During the period of the sleep mode, an output current of, for example, 0.2 mA is fed.

Many widely different embodiments of the invention may be configured without departing from the spirit and the scope of the present invention. It should be understood that the present invention is not limited to the specific embodiments described in the specification, except as defined in the appended claims.

The invention claimed is:

1. An A/D converter having a low-voltage differential signal output circuit, comprising:
   an output current value designation device for designating an output current value so that output currents to be fed from the low-voltage differential signal output circuit can be changed between an active mode in which an output of the A/D converter is valid and a sleep mode in which the output of the A/D converter is invalid.

2. The A/D converter according to claim 1, wherein the output current value designation device designates an output current value according to a value held in an output current value designation register.

3. An A/D converter control method, wherein values to be held in an output current value designation register are changed between an active mode in which the output of the A/D converter set forth in claim 2 is valid and a sleep mode in which the output thereof is invalid.

4. The A/D converter according to claim 1, wherein the output current value designation device designates an output current value according to a voltage applied to an output current value designation terminal.

5. An A/D converter control method, wherein voltages to be applied to an output current value designation terminal are changed between an active mode in which the output of the A/D converter set forth in claim 4 is valid and a sleep mode in which the output thereof is invalid.

6. The A/D converter according to claim 1, wherein the output current value designation device designates an output current value according to a current supplied to an output current value designation terminal.

7. An A/D converter control method, wherein currents to be supplied to an output current value designation terminal are changed between an active mode in which the output of the A/D converter set forth in claim 6 is valid and a sleep mode in which the output thereof is invalid.

8. The A/D converter according to claim 1, wherein the output current value designation device designates an output current value according to a resistance offered by a resistor connected to a resistor connection terminal.

9. An A/D converter control method, wherein resistors that are connected to a resistor connection terminal and offer different resistances are changed between an active mode in which the output of the A/D converter set forth in claim 8 is valid or a sleep mode in which the output thereof is invalid.

10. The A/D converter control method according to claim 1, wherein the A/D converter is incorporated in a receiving system included in a diagnostic ultrasound system, a period during which ultrasonic echoes are received is a period during which the active mode is validated, and the other period is a period during which the sleep mode is validated.

11. The A/D converter according to claim 1, further comprising a sleep current value designation device for designating an output current value smaller than the output current value designated by the output current value designation device, and a mode selection device for selecting either of the output current value designation device and the sleep current value designation device as a device, to which priority is given, according to a value held in a mode designation register.

12. The A/D converter according to claim 1, further comprising a sleep current value designation device for designating an output current value smaller than the output current value designated by the output current value designation device, and a mode selection device for selecting either of the output current value designation device and the sleep current value designation device as a device, to which priority is given, according to a voltage applied to a mode designation terminal.

13. The A/D converter according to claim 1, further comprising a sleep current value designation device for designating an output current value smaller than the output current value designated by the output current value designation device, and a mode selection device for selecting either of the output current value designation device and the sleep current value designation device as a device, to which priority is given, according to a current supplied to a mode designation terminal.

14. The A/D converter according to claim 11, wherein the A/D converter is incorporated in a receiving system included in a diagnostic ultrasound system, a period during which ultrasonic echoes are received is a period during which the active mode is validated, and the other period is a period during which the sleep mode is validated.

15. The A/D converter according to claim 1, wherein an output current value designated by the output current value designation device is equal to or smaller than 1.75 mA.

16. An A/D converter connection method, wherein a terminal resistor is connected near a pair of input terminals of a succeeding circuit that is connected to a pair of output terminals of the A/D converter set forth in claim 1, via a signal line pair, and at least one of the characteristic impedance of the signal line pair and the resistance of the terminal resistor is adjusted in order to ensure a certain amplitude for a signal at the pair of input terminals.

* * * * *